(12) United States Patent
Li

(10) Patent No.: US 10,798,845 B2
(45) Date of Patent: Oct. 6, 2020

(54) 1U RACKMOUNT ENCLOSURE AND 1U RACK

(71) Applicant: Shenzhen Fibercan Optical Co., Ltd, Guangdong (CN)

(72) Inventor: Yaole Li, Guangdong (CN)

( * ) Notice: Subject to any disclaimer, the term of this patent is extended or adjusted under 35 U.S.C. 154(b) by 0 days.

(21) Appl. No.: 16/492,620

(22) PCT Filed: May 4, 2017

(86) PCT No.: PCT/CN2017/082982
§ 371 (c)(1),
(2) Date: Sep. 10, 2019

(87) PCT Pub. No.: WO2018/171005
PCT Pub. Date: Sep. 27, 2018

(65) Prior Publication Data
US 2020/0053901 A1   Feb. 13, 2020

(30) Foreign Application Priority Data
Mar. 24, 2017   (CN) .......................... 2017 1 0184202

(51) Int. Cl.
*G02B 6/44* (2006.01)
*H05K 7/14* (2006.01)

(52) U.S. Cl.
CPC ......... *H05K 7/1489* (2013.01); *H05K 7/1418* (2013.01); *H05K 7/1491* (2013.01); *H05K 7/1492* (2013.01)

(58) Field of Classification Search
CPC ................................................... G02B 6/4453
See application file for complete search history.

(56) References Cited

U.S. PATENT DOCUMENTS

| 8,452,148 | B2* | 5/2013 | Cooke | G02B 6/4455 |
| | | | | 385/135 |
| 9,128,262 | B2* | 9/2015 | Campbell | G02B 6/4453 |
| 9,516,781 | B2* | 12/2016 | Ray | H05K 7/186 |
| 9,666,999 | B2* | 5/2017 | Seo | G02B 6/4453 |
| 2012/0114295 | A1* | 5/2012 | Guzzo | G02B 6/4453 |
| | | | | 385/135 |
| 2014/0248028 | A1* | 9/2014 | Campbell | G02B 6/4478 |
| | | | | 385/135 |

* cited by examiner

*Primary Examiner* — Sung H Pak
(74) *Attorney, Agent, or Firm* — Prakash Nama; Global IP Services, PLLC

(57) ABSTRACT

A 1 U connection chassis and a 1 U cabinet, wherein two or more intermediate plates (16) mutually parallel to one another are disposed inside the 1 U connection chassis; each of the intermediate plates (16) is provided with one or more slots mutually parallel to one another; two opposing slots on two adjacent intermediate plates (16) respectively constitute a mounting dock; an adaptor module (18) or a splice tray (19) is slidably inserted into each mounting dock; optical fiber adaptors are mounted inside the adaptor module (18). The chassis has optimized internal mounting space to allow more adaptor modules and/or splice trays to be mounted in the limited mounting space.

8 Claims, 10 Drawing Sheets

1U RACKMOUNT ENCLOSURE AND 1U RACK

BACKGROUND OF THE INVENTION

The present invention relates to the technical field of optical fiber communication, and more specifically relates to a 1 U connection chassis and a 1 U cabinet.

In recent years, with the development of the communication industry, development of optical communication is rapid, and chassis being an important part of optical communication (photoelectric conversion, connection and transfer) is being developed in a very rapid speed. With increased spatial cost, the space of an equipment room is particularly important. It is crucial for cost control to arrange more optical fibers in a limited space. A connection chassis is a photoelectric transfer chassis in the equipment room, and a number of optical fiber adaptors inside the chassis determines the number of connections: the more the optical fiber adaptors, the more the optical fibers in the chassis will be connected/transferred, and thus the fewer the chassis will be required, thereby saving many spaces in the equipment room in order to accommodate other types of chassis.

An outer dimensional of a server is usually measured by U, which stands for Unit. A 1 U chassis has a width of 19 inches and a height of 4.445 cm. Detailed dimensions are determined by the Electronic Industries Alliance (EIA).

In practice, a 1 U connection chassis has the following disadvantages:

1. In an existing chassis, optical fiber adaptors are usually mounted on a front panel of the chassis by opening holes on the front panel. Due to the limited space of the front panel, the front panel is not able to accommodate too many optical fiber adaptors, thereby requiring more chassis to satisfy the need for connection/transfer of optical fibers.

2. In most chassis, the front panel is adaptable to only limited types of optical fiber adaptors. Usually, a type of optical fiber adaptor only corresponds to one type of panel. If other types of optical fiber adaptors are required during replacement, the front panel of the chassis has to be replaced as well. Therefore, operation of such product is inconvenient.

BRIEF SUMMARY OF THE INVENTION

The present invention provides a 1 U connection chassis and a 1 U cabinet to optimize the internal mounting space inside the chassis, so as to mount more optical fiber adaptors and/or splice trays in a limited amount of space.

To attain the above object, the present invention provides the following technical solutions according to an embodiment:

A 1 U connection chassis, wherein two or more intermediate plates mutually parallel to one another are disposed inside the 1 U connection chassis; each of the intermediate plates is provided with one or more slots mutually parallel to one another; two opposing slots on two adjacent intermediate plates respectively constitute a mounting dock; an adaptor module or a splice tray is slidably inserted into each mounting dock; optical fiber adaptors are mounted inside the adaptor module.

In a possible embodiment of the present invention, the 1 U connection chassis comprises a wiring board; the intermediate plates are provided on the wiring board; a cover is disposed above the intermediate plates; a front wire management station is disposed at a front end of the wiring board; a rear wire management station is disposed at a rear end of the wiring board; a front cover is disposed above the front wire management station; a rear cover is disposed above the rear wire management station; the wiring board, the front wire management station, the rear wire management station, the rear cover, the cover and the front cover together form a shape of a box; the intermediate plates are located inside the box shaped 1 U connection chassis.

In a possible embodiment, a front end of the front cover is provided with a front baffle, and a rear end of the front cover is provided with an insertion groove; the front cover can be connected and fixed to the cover through the insertion groove; the front cover can also be connected and fixed to the front wire management station through the insertion groove so as to be used as a work bench.

In a possible embodiment, the 1 U connection chassis further comprises a plurality of magnetic wire clamps that arrange the wires; the magnetic wire clamps are fixed by magnetic connection to different components of the 1 U connection chassis; each of the magnetic wire clamps comprises a wire clamp body and a wire clamp base which are capable of being fitted and locked with each other, and a magnet embedded between the wire clamp body and the wire clamp base; the wire clamp body is provided with a plurality of wire management holes.

In a possible embodiment, the adaptor module has two elastic connecting arms on two sides thereof respectively; the two elastic connecting arms correspond to the mounting dock.

In a possible embodiment, each of the slots is provided with an inwardly recessed latching groove, and each of the elastic connecting arms is provided with a protruding latching pin at a position corresponding to the latching groove; when the adaptor module is inserted into the mounting dock, the adaptor module is fixed in the mounting dock when the latching pin of each of the elastic connecting arms is inserted into the corresponding latching groove; when the two elastic connecting arms are bent inwardly such that the latching pin of each of the elastic connecting arms is disengaged from the corresponding latching groove, the adaptor module can be pulled out from the mounting dock.

In a possible embodiment, one side of the 1 U connection chassis is further provided with a wire guiding frame for fixing and guiding the optical fiber wires; the wire guiding frame comprises a mounting portion that mounts to said one side of the 1 U connection chassis, and a guiding portion that fixes and guides the optical fiber wires and has a guiding hole.

In a possible embodiment, the adaptor module comprises one or more of the following modules: an LC/SC cable management module for installing an LC/SC adaptor, an LC/MPO cable management module for mounting an LC/MPO adaptor, and an MPO adaptor frame for mounting an MPO adaptor.

In a possible embodiment, the 1 U connection chassis specifically comprises five intermediate plates, and each of the intermediate plates is provided with three slots on one side thereof opposing another adjacent intermediate plate, thereby forming a total of twelve mounting docks arranged in three rows and four columns.

On the other hand, the present invention also provides a 1 U cabinet mounted with said 1 U connection chassis.

As described above, according to some embodiments of the present invention, intermediate plates each comprising slots are used in the chassis to form a plurality of mounting docks, wherein adaptor modules and/or a splice trays are inserted respectively into the mounting docks, while the optical fiber adaptors are mounted in the adaptor modules.

By means of such described technical solutions, the present invention has the following technical effects:

On one hand, the optical fiber adaptors and/or the splice trays are installed in the mounting docks inside the chassis, therefore, installation is no longer limited by the small installation area of the front panel of the chassis. It is now possible to mount more optical fiber adaptors and/or splice trays in the limited space inside the chassis. Further, a plurality of intermediate plates can be provided, and a plurality of slots can be arranged on each of the intermediate plates, so that a plurality of mounting docks can be formed in a plurality of rows and columns to install and fix the adaptor modules, thereby further optimizing the installation space to facilitate the arrangement and installation of more optical fiber adaptors inside the chassis.

On the other hand, the present invention adopts a modular installation method that first installs an optical fiber adaptor in the adaptor module, and then installs the adaptor module into a corresponding mounting dock in the chassis, wherein the adaptor module is slidably inserted into the corresponding mounting dock. Such method facilitates easy dismounting such that it can be very convenient to replace the existing optical fiber adaptors by different types of optical fiber adaptors. Also, the modular installation method allows different types of optical fiber adaptors to be installed simultaneously in the chassis.

Further, adaptor modules mounted with the optical fiber adaptors are mounted one by one into the formed mounting docks, so as to facilitate orderly arrangement of the optical fiber wires inside the chassis.

Further:

According to a preferred embodiment, apart from being connected and fixed to the cover through the insertion groove to be used as a front cover, the front cover can also be connected and fixed to the front wire management station via the insertion groove so as to be used as a work bench to increase the amount of operation space.

According to a preferred embodiment, the 1 U connection chassis further includes a plurality of magnetic wire clamps for arranging the wires. The magnetic wire clamps are fixed to the various components of the 1 U connection chassis by magnetic connection; such mobile nature of the magnetic wire clamps can be conveniently used to organize the optical fiber wires inside the chassis to avoid disordered arrangement of optical fiber wires.

According to a preferred embodiment, the adaptor module comprises two elastic connecting arms provided on both sides thereof respectively. The two elastic connecting arms correspond to a corresponding mounting dock; the adaptor module can be conveniently inserted into or removed from a corresponding mounting dock via the two elastic connecting arms, thereby increasing the operability of the present invention.

According to a preferred embodiment, each slot is provided with an inwardly recessed latching groove; a protruding latching pin is provided on a corresponding elastic connecting arm at a position corresponding to the latching groove; by means of the latching groove and the corresponding latching pin, it is easy to achieve locking and unlocking of the adaptor module with respect to the corresponding mounting dock.

BRIEF DESCRIPTION OF THE DRAWINGS

In order to describe clearly the technical solutions of the present invention according to some embodiments, the figures required for illustrating the embodiments and also the prior art will be briefly described below. Obviously, the figures described below are only intended to illustrate some embodiments of the present invention. A person skilled in the art may obtain other figures without the need of any inventive effort based on the figures disclosed herein.

REFERENCES IN THE FIGURES

Figure 1:
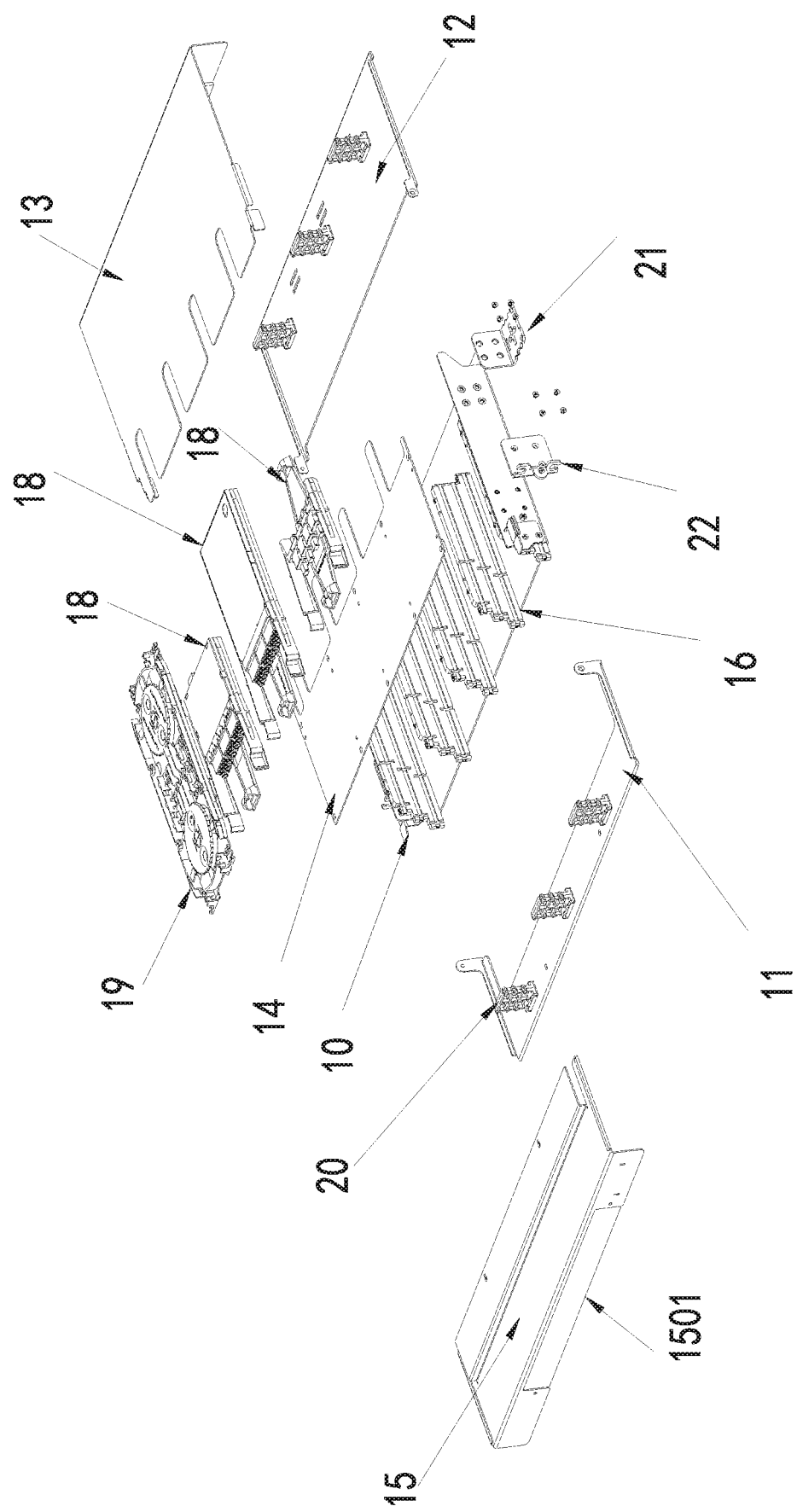
FIG. 1 is an exploded view of a 1 U connection chassis according to an embodiment of the present invention.

10—wiring board; 11—front wire management station; 12—rear wire management station; 13—rear cover, 14—cover 15—front cover; 1501—front baffle; 1502—insertion groove; 1503—lower strips; 1504—upper plate; 1505—rivet holes; 16—intermediate plates; 1601—slots; 1602—latching groove; 17—mounting dock; 18—adaptor module; 18a—LC/SC cable management module; 18b—LC/MPO cable management module; 18c—MPO adaptor frame; 1801—elastic connecting arms; 1802—latching pin; 19—splice tray; 20—magnetic wire clamps; 201—wire clamp body; 202—wire clamp base; 203—magnet; 204—wire management holes; 21—wire guiding frame; 2101—mounting portion; 2102—guiding portion; 2103—guiding hole; 22—mounting lug; 30—frames.

DETAILED DESCRIPTION OF THE INVENTION

In order that a person skilled in this field of art can understand the present invention in a better way, the present invention will be clearly and thoroughly described below with reference to some embodiments and the figures illustrating the embodiments. Obviously, the embodiments described are only some of the possible embodiments of the present invention, and do not include all possible embodiments. All other embodiments obtainable by a person skilled in this field of art without any inventive effort based on the teachings of the embodiments described herein should also fall within the scope of protection of the present invention.

Terms such as "First", "Second" and "Third" etc appearing in the description, claims and the drawings described above are intended to differentiate different subjects, but not intended to describe a particular sequence. Also, terms such as "comprising", "including" and any other variations thereof are intended to mean non-exclusive coverage. For example, a process, method, system, product or equipment that "comprises" a series of steps or modules does not mean that the process, method, system, product or equipment only has the steps or modules as disclosed; by contrast, the process, method, system, product or equipment may optionally include steps or modules that are not described in the description, or other steps or modules that are inherent in the process, method, system, product or equipment.

The present invention will be further described in detail below with reference to the embodiments.

As described in the background of invention, optical fiber adaptors are usually mounted on a front panel of a chassis according to an existing 1 U connection chassis. In other words, holes are opened on the front panel of the chassis to mount the optical fiber adaptors. Dimensions of the 1 U connection chassis determine dimensions of the front panel. The 1 U connection chassis has a height of 44.45 mm and a width of 19 inches. Therefore, not many optical fiber adaptors can be mounted on the front panel. Also, a front panel usually corresponds to the mounting of only one type of optical fiber adaptors, therefore when it is required to use another type of optical fiber adaptors, the front panel has to be removed and replaced by another front panel that corresponds to said another type of optical fiber adaptors. The front panel can only be removed after loosening the screws at the two ends of the front panel, thereby causing much inconvenience during use.

In view of the above, the present invention provides a 1 U connection chassis and a 1 U cabinet to optimize the internal mounting space inside the chassis, so as to mount more optical fiber adaptors and/or splice trays in a limited amount of space.

FIG. 1 shows an exploded structural view of a 1 U connection chassis according to an embodiment of the present invention.

As shown in FIG. 1, the 1 U connection chassis mainly comprises: a wiring board 10, the front wire management station 11, a rear wire management station 12, a rear cover 13, a cover 14, and a front cover 15 etc.

Figure 2:
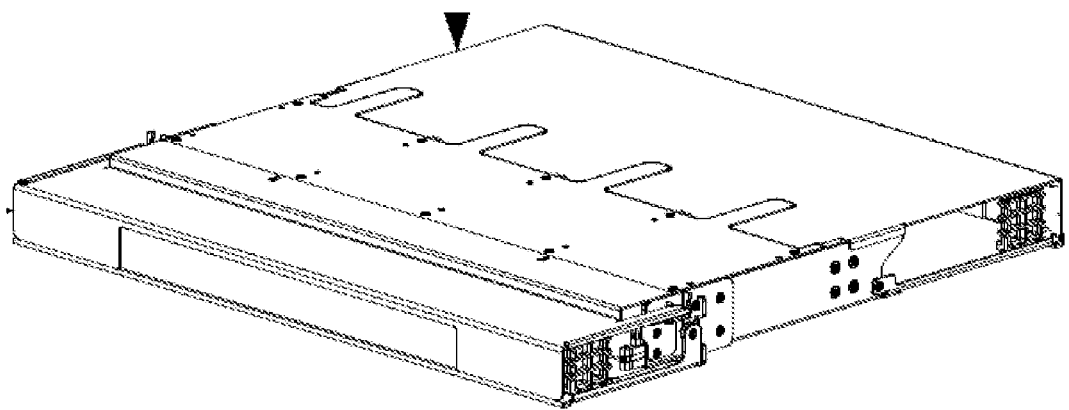
FIG. 2 is a schematic structural view of the 1 U connection chassis according to an embodiment of the present invention.

As shown in FIG. 2, the above components can form a shape of a box. The 1 U connection chassis in such a shape of a box has a height of 44.5 mm and a width of 19 inches.

Figure 3:
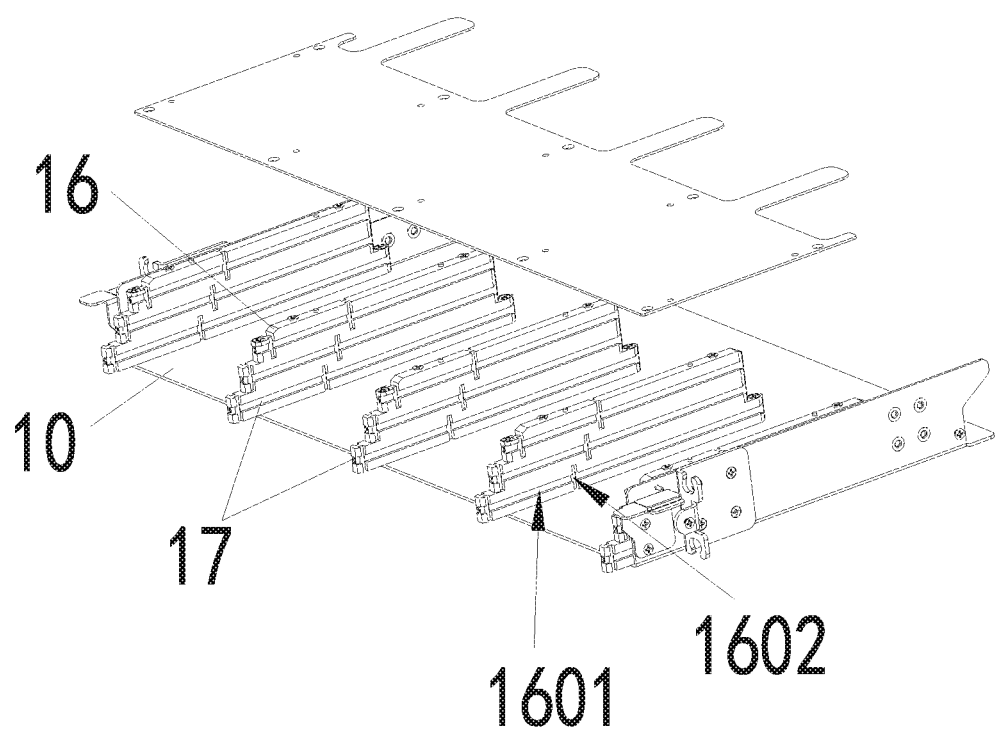
FIG. 3 illustrates an arrangement of the intermediate plates in the 1 U connection chassis according to an embodiment of the present invention.

As shown in FIG. 3, in an embodiment of the present invention, two or more intermediate plates 16 mutually parallel to one another are disposed inside the 1 U connection chassis. Each of the intermediate plates 16 is provided with one or more slots 1601 mutually parallel to one another, two opposing slots 1601 on two adjacent intermediate plates 16 respectively constitute a mounting dock 17.

Figure 4:
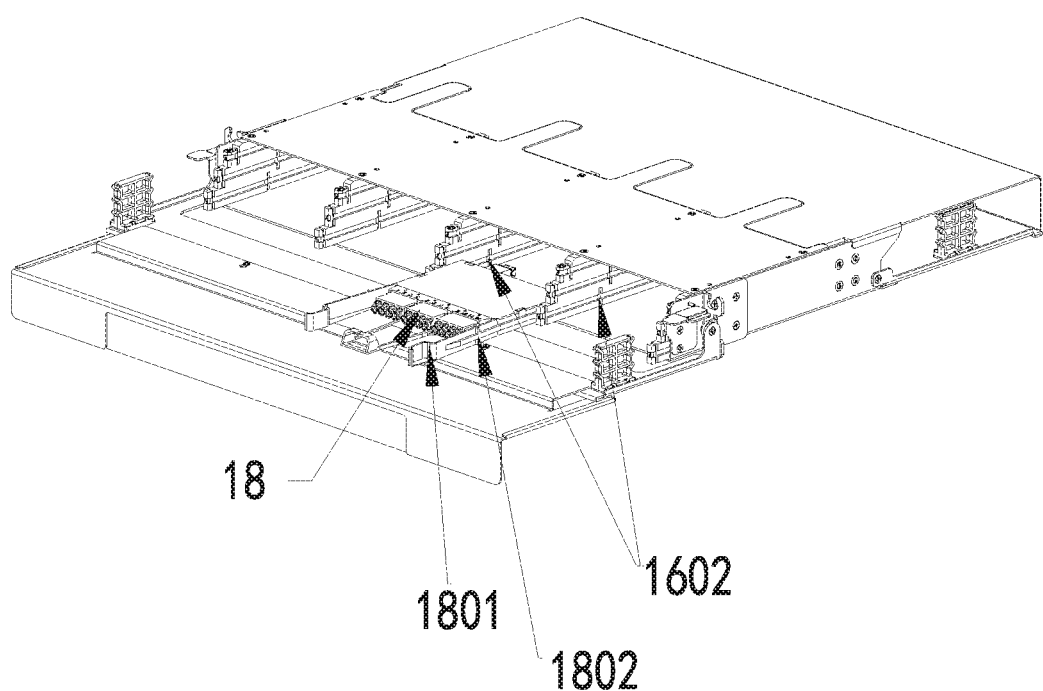
FIG. 4 shows an adaptor module to be inserted into the 1 U connection chassis.

As shown in FIG. 4, an adaptor module 18 or a splice tray 19 can be slidably inserted into each mounting dock 17; optical fiber adaptors are mounted inside the adaptor module 18.

The intermediate plates 16 are provided on the wiring board 10 and located inside the box shaped 1 U connection chassis.

As shown in FIG. 1 and FIG. 2, in an embodiment of the present invention, the cover 14 is disposed above the wiring board 10 and the intermediate plates 16; the front wire management station 11 is disposed at a front end of the wiring board 10; the rear wire management station 12 is disposed at a rear end of the wiring board 10; the front cover 15 is disposed above the front wire management station 11; the rear cover 13 is disposed above the rear wire management station 12.

As shown in FIG. 1, in an embodiment of the present invention, a mounting lug 22 is mounted on each of two sides of the wiring board 10 to mount the 1 U connection chassis to a bracket of a 1 U cabinet. Two hooks are provided on each mounting lug 22, and a distance between the two hooks matches with a distance between mounting holes on the frames of the 1 U cabinet, so that screws can be inserted through the hooks into the mounting holes of the frames to achieve fixation.

Figure 5:
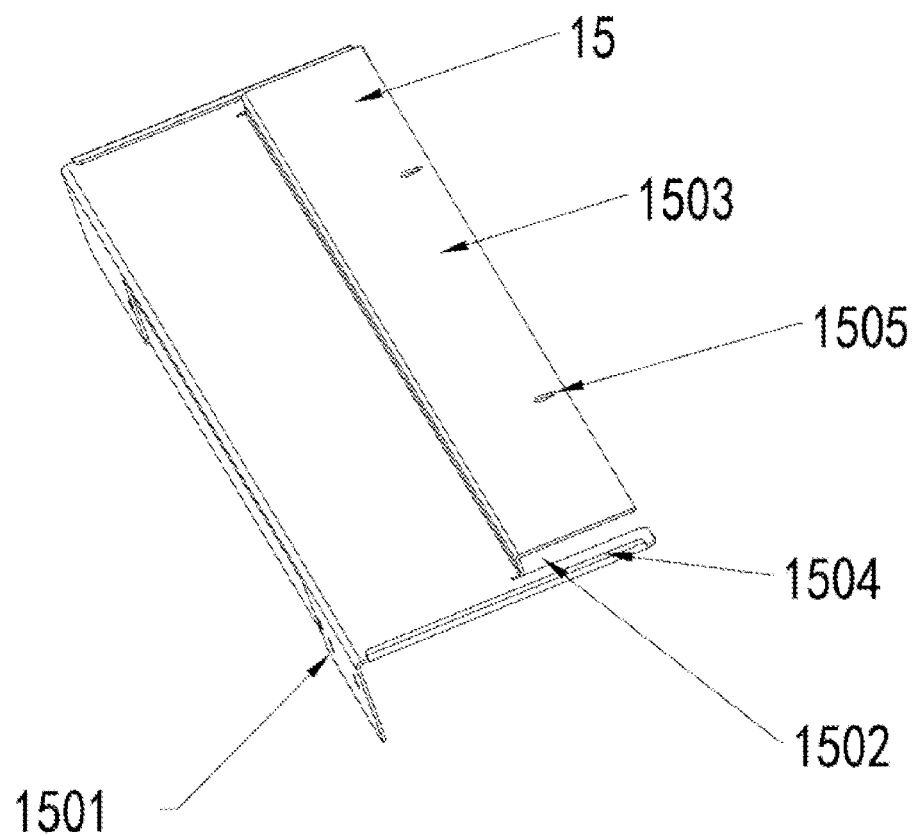
FIG. 5 is a structural view of the front cover of the 1 U connection chassis.

As shown in FIG. 5, in an embodiment of the present invention, a front end of the front cover 15 is provided with a front baffle 1501, and a rear end of the front cover 15 is provided with an insertion groove 1502; wherein the front baffle 1501 is perpendicular to or nearly perpendicular to a main body of the front cover 15; the insertion groove 1502 is formed by two lower strips 1503 at two ends of the front cover 15 respectively and an upper plate 1504 located at between the lower strips, and the lower strips 1503 and the upper plate 1504 are vertically spaced apart by a certain distance to form the insertion groove 1502; a height of the insertion groove 1502 matches with a thickness of the cover 14 and a thickness of the front wire management station 11. Therefore, the front cover 15 can be connected and fixed to the cover 14 through the insertion groove 1502, and hence to be used as a front cover. After the front cover is connected and fixed to the cover 14, the front baffle 1501 blocks openings at a front end of the 1 U connection chassis.

Figure 6:
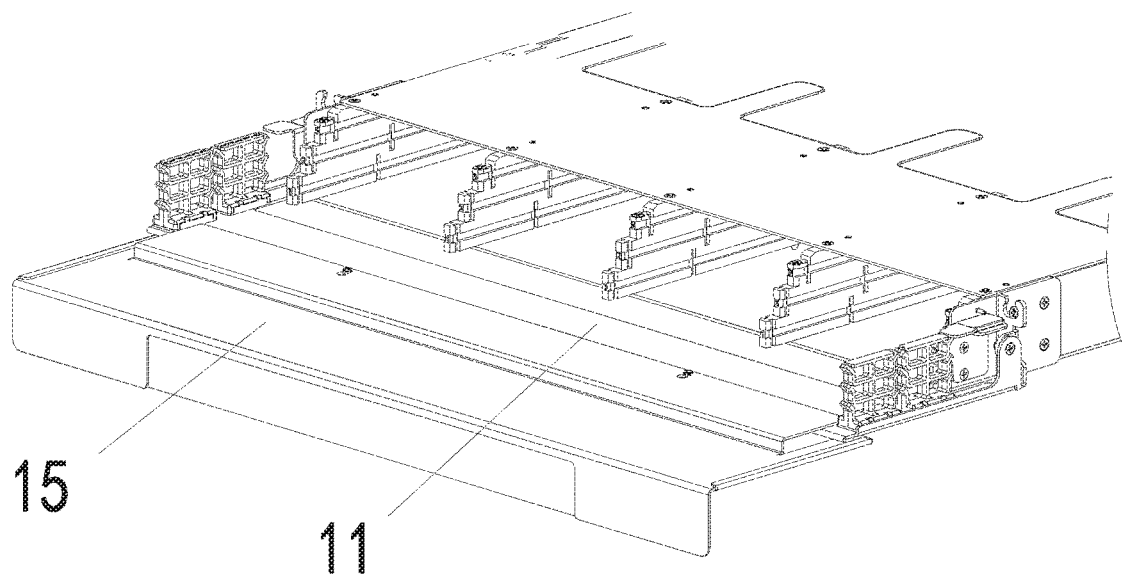
FIG. 6 is a structural view showing the use of the front cover of the 1 U connection chassis as a work bench.

As shown in FIG. 6, the front cover 15 can also be connected and fixed to the front wire management station 11 through the insertion groove 1502, so as to be used as a work bench to increase operation space; wherein, the front wire management station 11 is provided with two or more rivets, and the upper plate 1504 is provided with two or more rivet holes 1505 corresponding to the two or more rivets, and each of the rivet holes 1505 can be configured to have a smaller hole opening at one end and a larger hole opening at another end, so that the rivets can only be inserted into the rivet holes 1505 from the larger hole opening, and cannot be removed from the smaller hole opening. When the front cover 15 is required to be used as a work bench, the rivet holes on the front cover 15 and the rivets of the front wire management station 11 are aligned, the insertion groove 1502 is then inserted with the front wire management station 11, and the insertion groove 1502 and the front wire management station 11 are secured via the rivets and the rivet holes.

As shown in FIG. 1, in an embodiment of the present invention, the 1 U connection chassis further comprises a plurality of magnetic wire clamps 20 that arrange the wires; the magnetic wire clamps 20 are fixed by magnetic connection to different components of the 1 U connection chassis such as the front wire management station 11, the rear wire management station 12, or other components.

Figure 7:
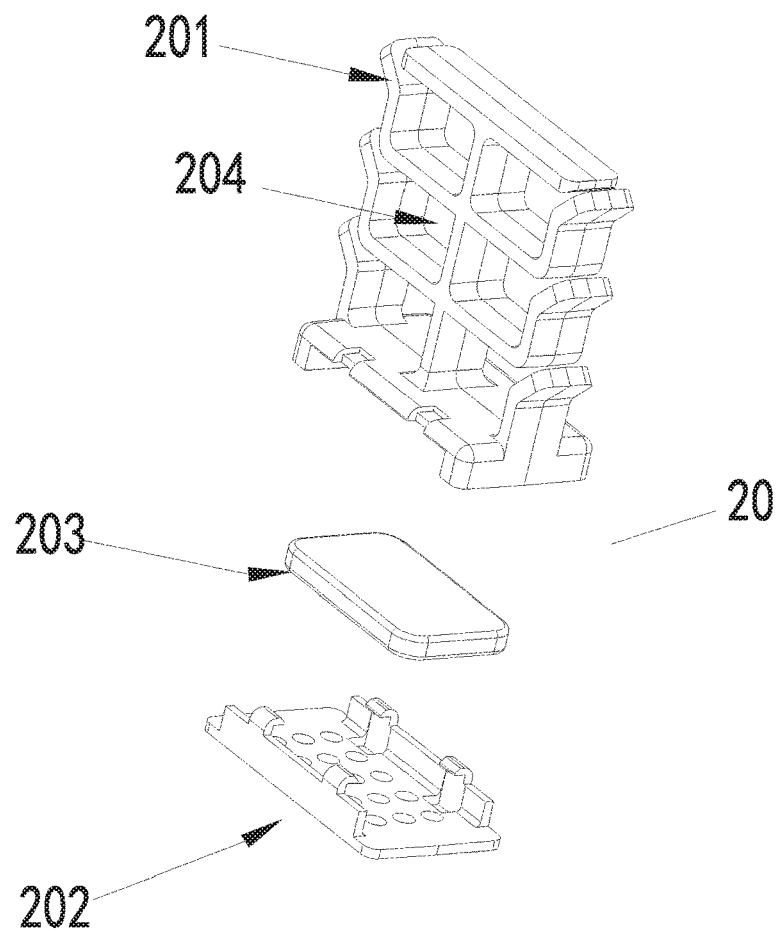
FIG. 7 is an exploded view of a magnetic wire clamp of the 1 U connection chassis.

As shown in FIG. 7, each of the magnetic wire clamps 20 may comprise a wire clamp body 201 and a wire clamp base 202 which are capable to be fitted and locked with each other, and a magnet 203 embedded between the wire clamp body 201 and the wire clamp base 202; the wire clamp body 201 is provided with a plurality of wire management holes 204; a corner of each of the wire management holes 204 is provided with an opening so that an optical fiber wire can be arranged in a corresponding wire management hole 204 through the opening.

In an embodiment of the present invention, preferably, components such as the wiring board 10, the front wire management station 11, the rear wire management station 12, the rear cover 13, the cover 14, and the front cover 15 are all made of magnetic metal materials, so that the magnetic wire clamps 20 can be fixed to any desired positions by magnetic connection.

Figure 8:
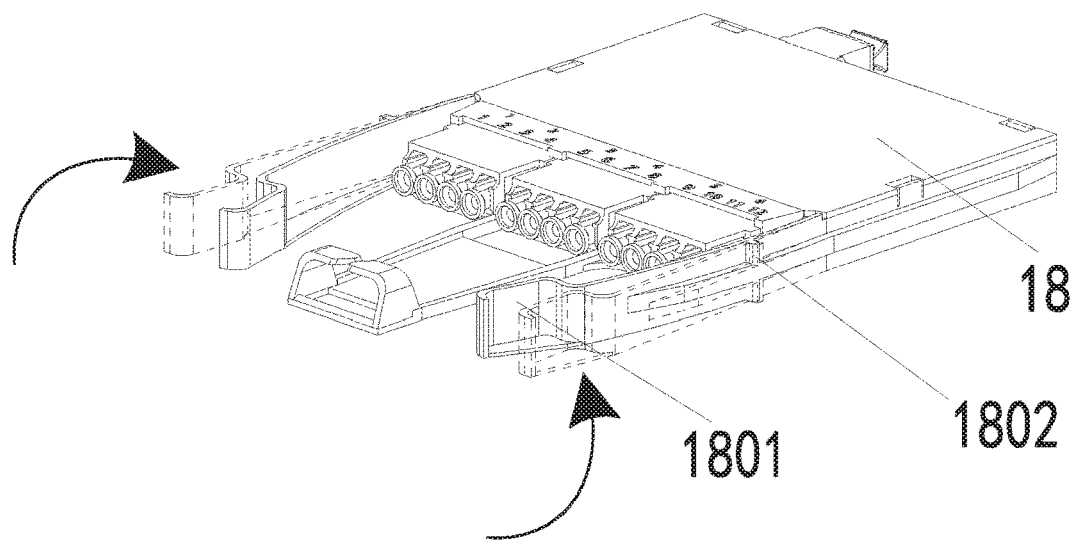
FIG. 8 is a structural view of an adaptor module.

FIG. 8 is a schematic structural diagram of an adaptor module 18. The adaptor module 18 has two elastic connecting arms 1801 on two sides thereof respectively; the two elastic connecting arms 1801 correspond to the mounting dock 17 and can be inserted into the mounting dock 17. The elastic connecting arms 1801 can be bent inward by using force; as shown in FIG. 8, the broken lines indicate the original positions of the elastic connecting arms 1801, and the solid lines indicate the positions of the elastic connecting arms 1801 after being bent inwardly. Due to the elasticity of the elastic connecting arms 1801, the adaptor module 18 can be easily inserted into or removed from the mounting dock 17.

In some embodiments, as shown in FIG. 3, each of the slots 1601 is provided with an inwardly recessed latching groove 1602, and each of the elastic connecting arms 1801 is provided with a protruding latching pin 1802 at a position corresponding to the latching groove 1602.

As shown in FIG. 4, when the adaptor module 18 is inserted into the mounting dock 17, the adaptor module 18 is fixed in the mounting dock 17 when the latching pin 1802 of each of the elastic connecting arms is inserted into the corresponding latching groove 1602.

When the two elastic connecting arms 1801 are bent inwardly such that the latching pin 1802 of each of the elastic connecting arms is disengaged from the corresponding latching groove 1602, the adaptor module 18 can be pulled out from the mounting dock 17.

As described above, locking and unlocking of the adaptor module 18 with the mounting dock 17 can be easily achieved by the latching groove 1602 and the corresponding latching pin 1802.

Figure 9:
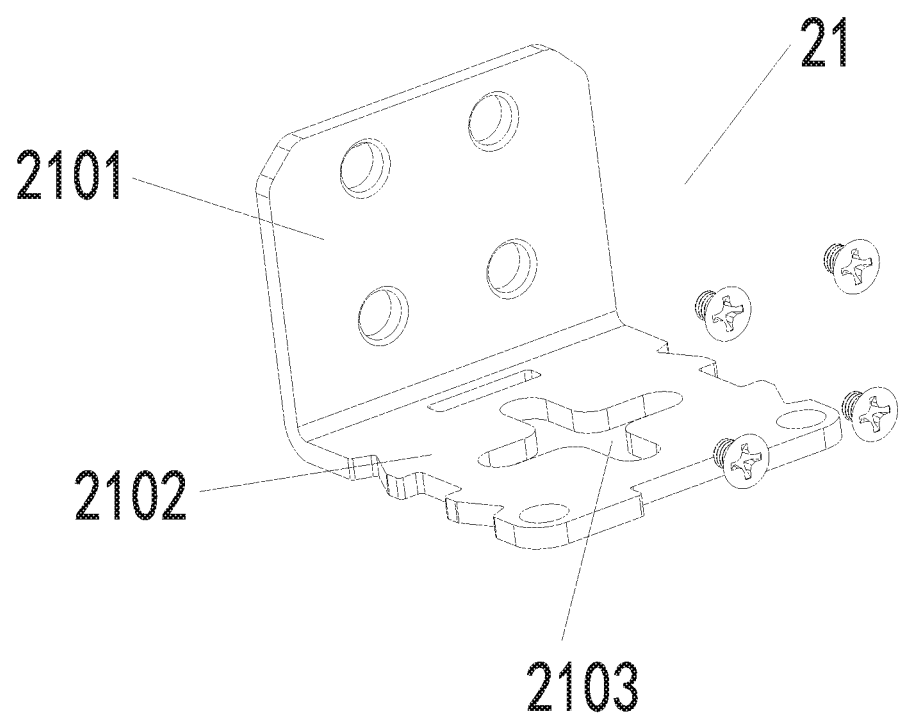
FIG. 9 is a structural view of a wire guiding frame of the 1 U connection chassis.

Referring to FIG. 1 and FIG. 9, in some embodiments of the present invention, one side of the 1 U connection chassis is further provided with a wire guiding frame 21 for fixing and guiding the optical fiber wire; the wire guiding frame 21 comprises a mounting portion 2101 that mounts to said one side of the 1 U connection chassis, and a guiding portion 2102 that fixes and guides the optical fiber wires and has a guiding hole 2103; wherein the mounting portion 2101 and the guiding portion 2102 are perpendicular or nearly perpendicular to each other; the mounting portion 2101 is provided with a plurality of mounting holes such that screws can pass through the mounting holes and fix to said one side of the 1 U connection chassis. Said one side of the 1 U connection chassis may specifically refer to one side of the wiring board 10.

Figure 10:
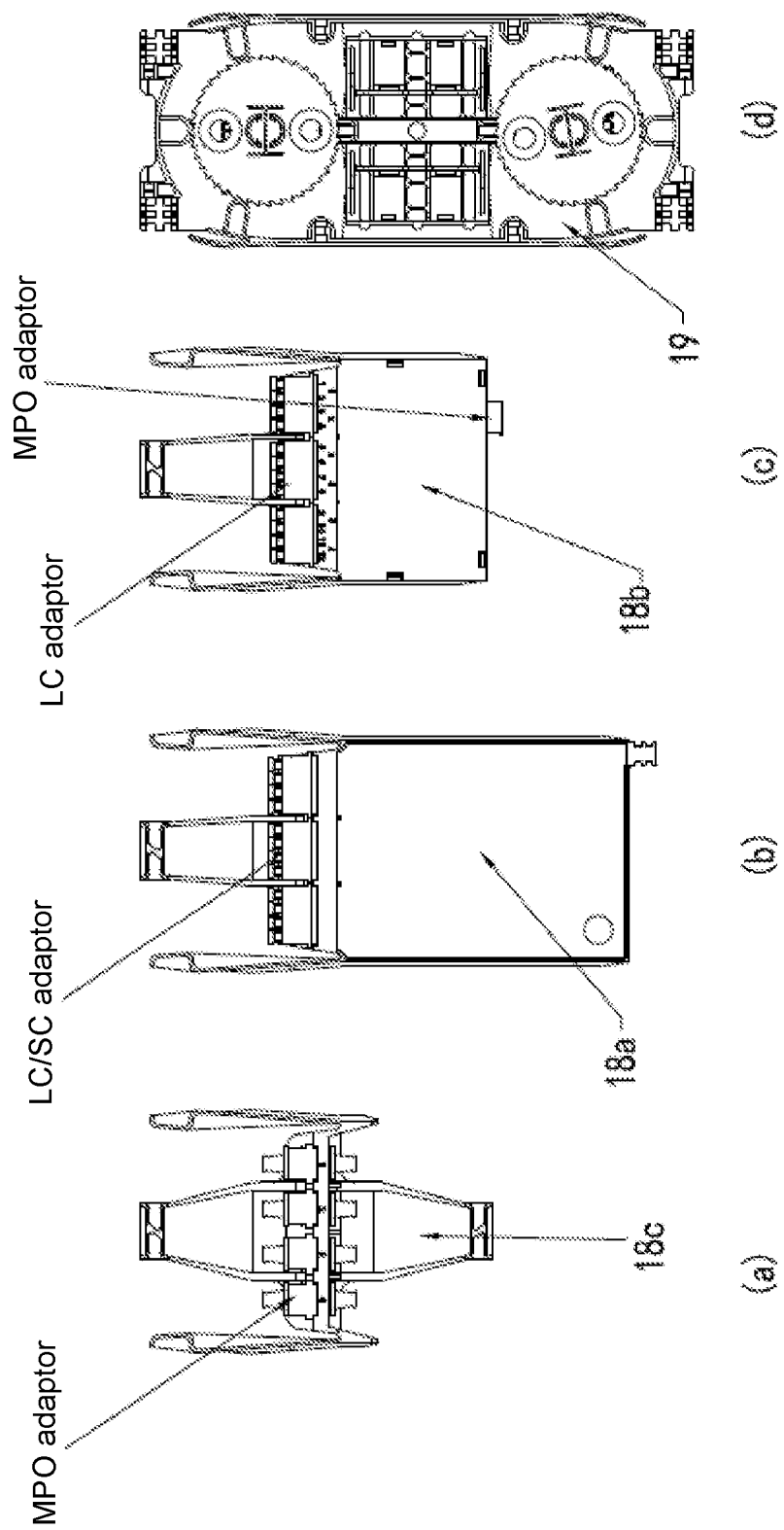
FIG. 10 shows different types of adaptor modules and splice trays.

It should be noted that, as shown in FIG. 10, in an embodiment of the present invention, the adaptor module 18 may include one or more of the following modules: an LC/SC cable management module 18a for installing an LC/SC adaptor, an LC/MPO cable management module 18b for mounting an LC/MPO adaptor, and an MPO adaptor frame 18c for mounting an MPO adaptor, and the like. The splice tray 19 may be a 12/24-core splice tray with or without a hot air protection sleeve. The various kinds of adaptor module 18 and the splice tray 19 can have the same width, and each mounting dock on the 1 U connection chassis also has the same width, so that any mounting dock can be arbitrarily selected for installation.

Figure 11:
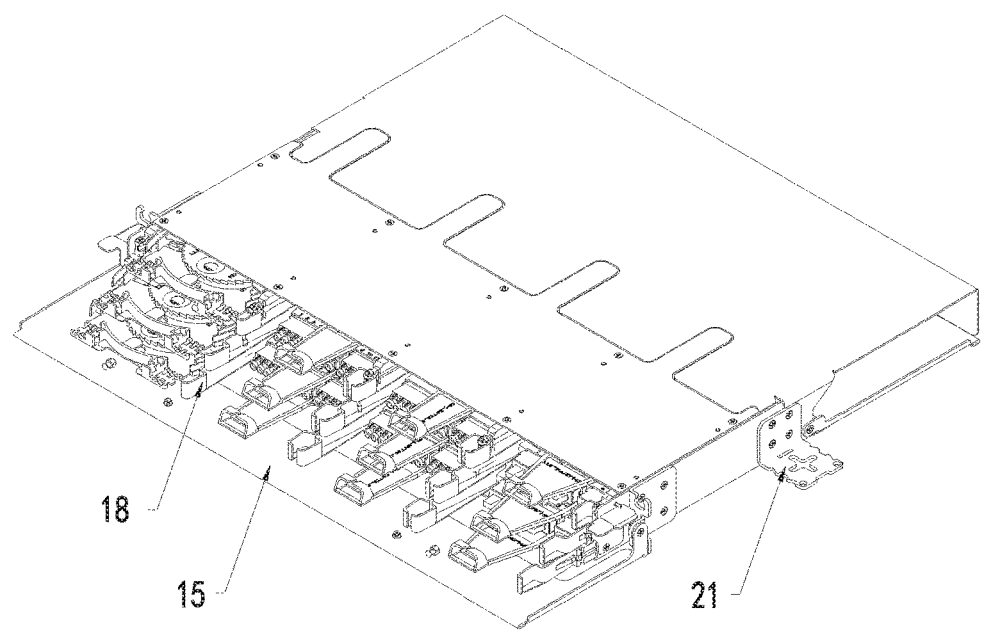
FIG. 11 is a structural view of the 1 U connection chassis according to an embodiment.

Referring to FIG. 11, in an embodiment of the present invention. Accordingly, there is a significant increase in the number of optical fiber adaptors that can be installed. It should be noted that, each of the intermediate plates 16 located at two outermost sides respectively is only required to provide the slots 1601 on an inner side thereof. Of course, in other embodiments, different numbers of mounting docks may be configured; the number of mounting docks should not be limited to the description herein.

Figure 12:
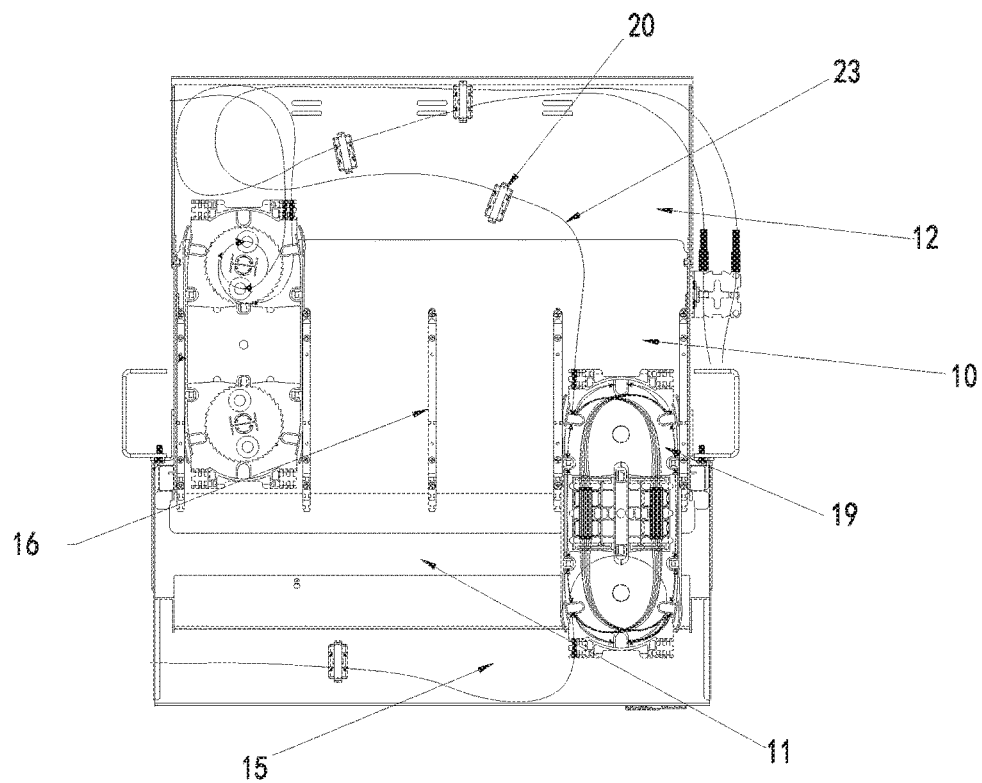
FIG. 12 shows the wire arrangement inside the 1 U connection chassis according to an embodiment.

FIG. 12 is a schematic diagram showing the wire arrangement inside the 1 U connection chassis according to an embodiment of the present invention. As an example, the figure illustrates the installation of a splice tray 19 and the like. As shown in the figure, the optical fibers 23 are fixed by a plurality of magnetic wire clamps 20 distributed at different positions, such that the optical fiber wires are neatly organized. In particular, the front cover 15 can be connected to the front wire management station 11 to form a work bench to enlarge the operation space, and some optical fiber wires 23 can also be fixed to the front cover 15 by the magnetic wire clamps 20. In addition, the optical fiber wires 23 outside the chassis can pass through the wire guiding frame 21 and be fixed by the wire guiding frame 21.

FIG. 12 illustrates a preferred arrangement of the optical fiber wires. Cable ties can be used to fix the optical fiber wires to the wire guiding frame 21. The magnetic wire clamps 20 can be used to restrict excessive movements of the optical fiber wires. A 39-inch optical fiber wire is recommended. The cable ties may also be used to secure the optical fiber wires to the adaptor module 18 or the splice tray 19.

It is to be noted that the 1 U connection chassis according to an embodiment of the present invention is mainly used for installing optical fiber adaptors and splice trays. The present invention provides a wiring solution, and the present invention is mainly used in a 1 U cabinet, which can also be called a 1 U cabinet type wiring box.

Figure 13A:
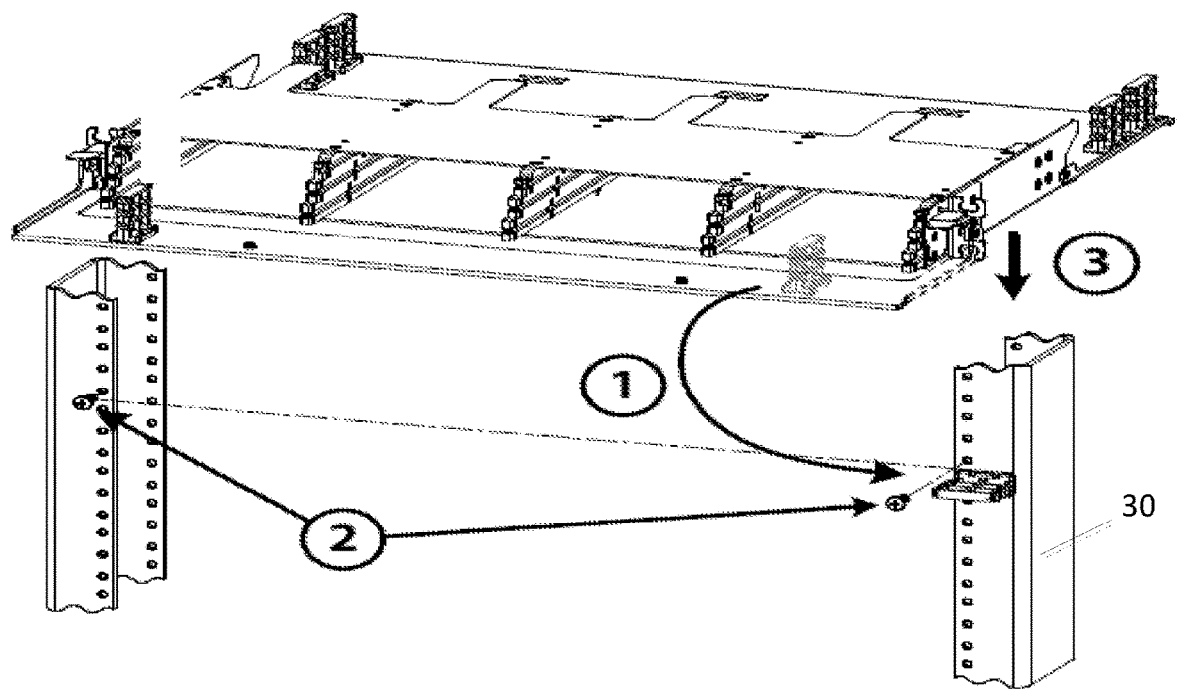
FIGS. 13a-13c illustrate a flow of process of mounting the 1 U connection chassis on a 1 U cabinet.
Figure 13B:
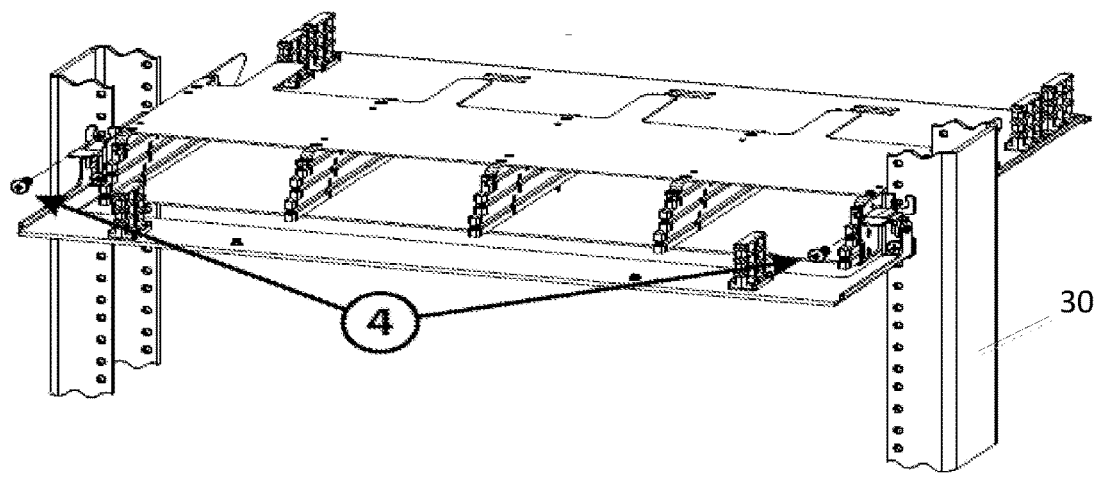
Figure 13C:
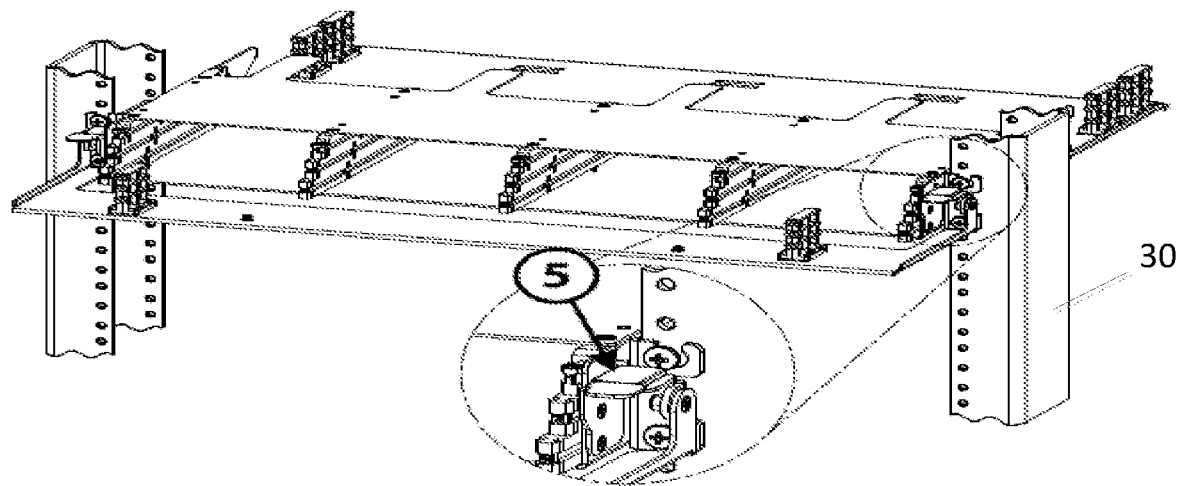

FIGS. 13a, 13b and 13c illustrate a process of installing the 1 U connection chassis into a 19-inch 1 U cabinet, comprising the following steps:

1. Aligning two frames 30 of the 1 U cabinet and aligning mounting holes thereon, placing a magnetic wire clamp 20 below a selected mounting hole on one of the two frames 30 as an indicating mark, and also selecting another mounting hole corresponding to the selected mounting hole on another one of the two frames;

2. Installing two screws into the two selected mounting holes respectively;

3. Placing the 1 U connection chassis into a space between the two frames 30, such that the two mounting lugs on two sides of the 1 U connection chassis respectively align with the two screws installed into the two selected mounting holes respectively;

4. Fixing two additional screws, together with the aforementioned two screws installed into the two selected mounting hole, to the four hooks on the two mounting lugs respectively, such that the two mounting lugs are in turns fixed to the two frames 30, thereby achieving installation and fixation of the 1 U connection chassis to the 1 U cabinet;

5. Optionally, fixing several magnetic wire clamps to various positions such as on the front cover.

Figure 13D:
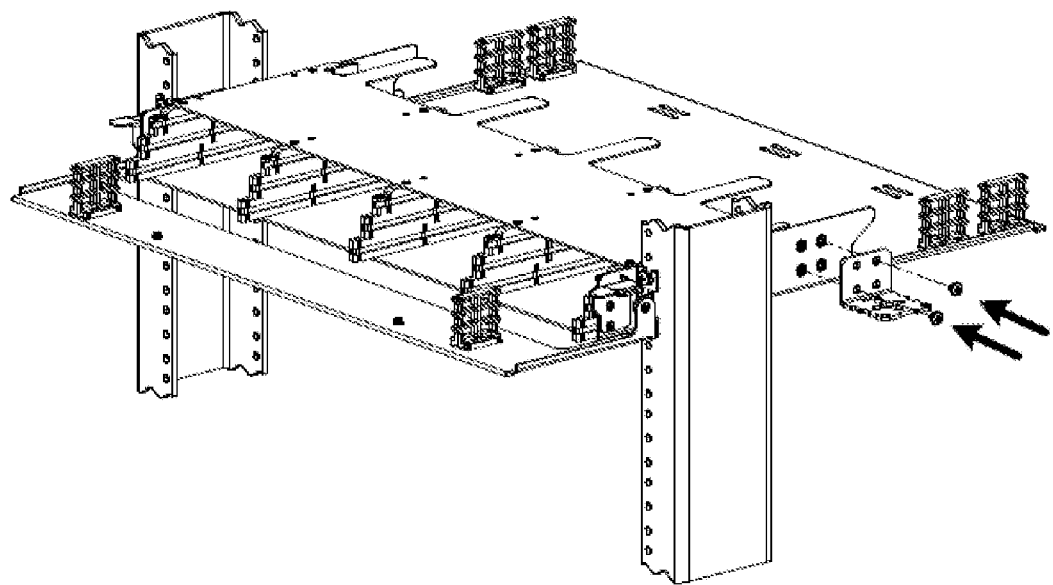
FIG. 13d shows the mounting of the wire guiding frame on one side of the 1 U connection chassis.

During the process of installing the 1 U connection chassis, the wire guiding frame is not pre-installed on the 1 U connection chassis. Instead, after the 1 U connection chassis is mounted to the 1 U cabinet, the wire guiding frame is then mounted to one side of the 1 U connection chassis via screws, as shown in FIG. 13d.

Next, install the adaptor modules and the splice trays and configure the optical fiber wires according to practical requirements.

Next, after installing the adaptor modules and the splice trays and configuring the optical fiber wires, mount the front cover and the rear cover etc.

If required, the front cover can be connected and fixed to the front wire management station to be used as a work bench.

As described above, an embodiment of the present invention also provides a 1 U cabinet; the 1 U cabinet is mounted with the 1 U connection chassis as described above. As shown in FIGS. 13a-13d, the 1 U cabinet comprises the frames; the 1 U connection chassis is mounted to the frames of the 1 U cabinet.

The 1 U connection chassis and the 1 U cabinet provided according to the embodiments of the present invention as described above have the following advantages:

1. The present invention adopts a modular design and a modular installation method that first installs an optical fiber adaptor in the adaptor module, and then installs the adaptor module into a corresponding mounting dock in the chassis. Accordingly, the installation density of the optical fiber adaptors can be effectively increased such that more optical fiber adaptors can be installed in a limited amount of space. Further, the modular design of the present invention facilitates mounting and dismounting, and it can be very convenient to replace the existing optical fiber adaptors by different types of optical fiber adaptors. Also, the modular installation method allows different types of optical fiber adaptors to be installed simultaneously in the chassis.

2. The optical fiber adaptors and/or the splice trays are installed in the mounting docks inside the chassis, therefore, installation is no longer limited by the small installation area of the front panel of the chassis. It is now possible to mount more optical fiber adaptors and/or splice trays in the limited space inside the chassis. Further, a plurality of intermediate plates can be provided, and a plurality of slots can be arranged on each of the intermediate plates, so that a plurality of mounting docks can be formed in a plurality of rows and columns to install and fix the adaptor modules, thereby further optimizing the installation space to facilitate the arrangement and installation of more optical fiber adaptors inside the chassis.

3. The adaptor module adopts a deformable design by pinching the two elastic connecting arms provided on both sides thereof. The two elastic connecting arms correspond to a corresponding mounting dock; the adaptor module can be conveniently inserted into or removed from mounting dock via the two elastic connecting arms, thereby increasing the operability of the present invention.

4. Apart from being connected and fixed to the cover through the insertion groove to be used as a front cover, the front cover can also be connected and fixed to the front wire management station via the insertion groove so as to be used as a work bench to increase the amount of operation space.

5. The 1 U connection chassis further includes a plurality of magnetic wire clamps for arranging the wires. the magnetic wire clamps are fixed to the various components of the 1 U connection chassis by magnetic connection; such mobile type of magnetic wire clamps can be conveniently used to organize the optical fiber wires inside the chassis to avoid disordered arrangement of optical fiber wires.

6. The 1 U connection chassis further includes a wire guiding frame disposed on one side of the chassis to facilitate guiding and fixing of the optical fiber wires.

7. Each slot is provided with an inwardly recessed latching groove; a protruding latching pin is provided on the elastic connecting arm at a position corresponding to the latching groove; by means of the latching groove and the corresponding latching pin, it is easy to achieve locking and unlocking of the adaptor module with respect to the corresponding mounting dock.

Each of the embodiments described above has its own main focus. Details that are not described in detail in a certain embodiment will be apparent by consulting the corresponding description in other embodiments.

The embodiments described above are only intended to illustrate the technical solutions of the present invention, and should not limit the present invention. A person skilled in this field of art may modify the technical solutions described in the above embodiments or replace some of the above disclosed technical features by other technical means having equivalent technical effects, and these modifications and replacements will not render the essence of the technical solutions to deviate from the spirit and scope of the technical solutions disclosed in the aforementioned embodiments of the present invention.

What is claimed is:

1. A 1 U connection chassis, wherein two or more intermediate plates mutually parallel to one another are disposed inside the 1 U connection chassis; each of the intermediate plates is provided with one or more slots mutually parallel to one another; two opposing slots on two adjacent intermediate plates respectively constitute a mounting dock; an adaptor module or a splice tray is slidably inserted into each mounting dock; optical fiber adaptors are mounted inside the adaptor module:
   the 1 U connection chassis further comprises a wiring board: the intermediate plates are provided on the wiring board; a cover is disposed above the intermediate plates;
   a front wire management station is disposed at a front end of the wiring board; a rear wire management station is disposed at a rear end of the wiring board; a front cover is disposed above the front wire management station; a rear cover is disposed above the rear wire management station;
   the wiring board, the front wire management station, the rear wire management station, the real cover, the cover and the front cover together form a shape of a box; the intermediate plates are located inside the box shaped 1 U connection chassis;
   a front end of the front cover is provided with a front baffle, and a rear end of the front cover is provided with an insertion groove;
   the front cover is capable to be connected and fixed to the cover through the insertion groove;
   the front cover is also capable to be connected and fixed to the front wire management station through the insertion groove so as to be used as a work bench.

2. The 1 U connection chassis of claim 1, wherein the 1 U connection chassis further comprises a plurality of magnetic wire clamps that arrange optical fiber wires; the magnetic wire clamps are fixed by magnetic connection to different components of the 1 U connection chassis; each of the magnetic wire clamps comprises a wire clamp body and a wire clamp base which are capable of being fitted and locked with each other, and a magnet embedded between the wire clamp body and the wire clamp base; the wire clamp body is provided with a plurality of wire management holes.

3. The 1 U connection chassis of claim 1, wherein the adaptor module has two elastic connecting arms on two sides thereof respectively; the two elastic connecting arms correspond to the mounting dock.

4. The 1 U connection chassis of claim 3, wherein each of the slots is provided with an inwardly recessed latching groove, and each of the elastic connecting arms is provided with a protruding latching pin at a position corresponding to the latching groove;

when the adaptor module is inserted into the mounting dock, the adaptor module is fixed in the mounting dock when the latching pin of each of the elastic connecting arms is inserted into the corresponding latching groove;

when the two elastic connecting arms are bent inwardly such that the latching pin of each of the elastic connecting arms is disengaged from the corresponding latching groove, the adaptor module is capable to be pulled out from the mounting dock.

5. The 1 U connection chassis of claims 1, 2-4, wherein one side of the 1 U connection chassis is further provided with a wire guiding frame for fixing and guiding the optical fiber wires; the wire guiding frame comprises a mounting portion that mounts to said one side of the 1 U connection chassis, and a guiding portion that fixes and guides the optical fiber wires and has a guiding hole.

6. The 1 U connection chassis of claims 1, 2-4, wherein the adaptor module comprises one or more of the following modules: an LC/SC cable management module for installing an LC/SC adaptor, an LC/MPO cable management module for mounting an LC/MPO adaptor, and an MPO adaptor frame for mounting an MPO adaptor.

7. The 1 U connection chassis of claim 1, 2-4, wherein the 1 U connection chassis comprises five intermediate plates, and each of the intermediate plates is provided with three slots on one side thereof opposing another adjacent intermediate plate, thereby forming a total of twelve mounting docks arranged in three rows and four columns.

8. A 1 U cabinet, wherein the 1 U cabinet is mounted with said 1 U connection chassis according to claim 1.

* * * * *